United States Patent
Lin et al.

(10) Patent No.: US 10,559,326 B1
(45) Date of Patent: Feb. 11, 2020

(54) HARD DISK BRACKET

(71) Applicant: HONGFUJIN PRECISION ELECTRONICS (TIANJIN) CO., LTD., Tianjin (CN)

(72) Inventors: Jia-Feng Lin, New Taipei (TW); Chieh-Hsiang Lin, New Taipei (TW)

(73) Assignee: HONGFUJIN PRECISION ELECTRONICS (TIANJIN) CO., LTD., Tianjin (CN)

(*) Notice: Subject to any disclaimer, the term of this patent is extended or adjusted under 35 U.S.C. 154(b) by 0 days.

(21) Appl. No.: 16/184,915

(22) Filed: Nov. 8, 2018

(30) Foreign Application Priority Data

Sep. 11, 2018 (CN) .......................... 2018 1 1058743

(51) Int. Cl.
*F16M 11/00* (2006.01)
*G11B 33/02* (2006.01)
*H05K 7/12* (2006.01)

(52) U.S. Cl.
CPC ............... *G11B 33/02* (2013.01); *H05K 7/12* (2013.01)

(58) Field of Classification Search
CPC ......... H05K 7/10; G06F 1/187; G11B 33/126; G11B 33/128; G11B 33/123
See application file for complete search history.

(56) References Cited

U.S. PATENT DOCUMENTS

| | | | |
|---|---|---|---|
| 7,483,268 B1* | 1/2009 | King, Jr. ................. | G06F 1/187 248/682 |
| 9,785,205 B2* | 10/2017 | Lien ........................ | G06F 1/187 |
| 2009/0091884 A1* | 4/2009 | Walker .................... | G06F 1/187 361/679.37 |
| 2009/0101781 A1* | 4/2009 | Peng ....................... | G11B 33/08 248/316.1 |
| 2012/0236511 A1* | 9/2012 | Shu ........................ | G11B 33/124 361/748 |

* cited by examiner

*Primary Examiner* — Amy J. Sterling
(74) *Attorney, Agent, or Firm* — ScienBiziP, P.C.

(57) ABSTRACT

A hard disk bracket for selectively mounting a first type of hard disk or a second type of hard disk includes a mounting frame, a rotating arm, a first rotating bracket, a second rotating bracket, a first latching member, and a second latching member. The rotating arm has one end rotationally coupled to the mounting frame and a second end configured to release or latch the hard disk. The first rotating bracket has one end rotationally coupled to the mounting frame and a second end rotatable about the first end. The second rotating bracket has one end rotationally coupled to the rotating arm and a second end rotatable about the first end. The first latching member is mounted to the mounting frame. The second latching member is mounted to the rotating arm.

20 Claims, 5 Drawing Sheets

HARD DISK BRACKET

FIELD

The subject matter herein generally relates to hard disk brackets, and more particularly to a hard disk bracket for mounting a first type of hard disk or a second type of hard disk.

BACKGROUND

Generally, hard disks are mounted to a bracket by screws to a chassis of a computer.

BRIEF DESCRIPTION OF THE DRAWINGS

Implementations of the present disclosure will now be described, by way of embodiment only, with reference to the attached figures.

DETAILED DESCRIPTION

Figure 1:
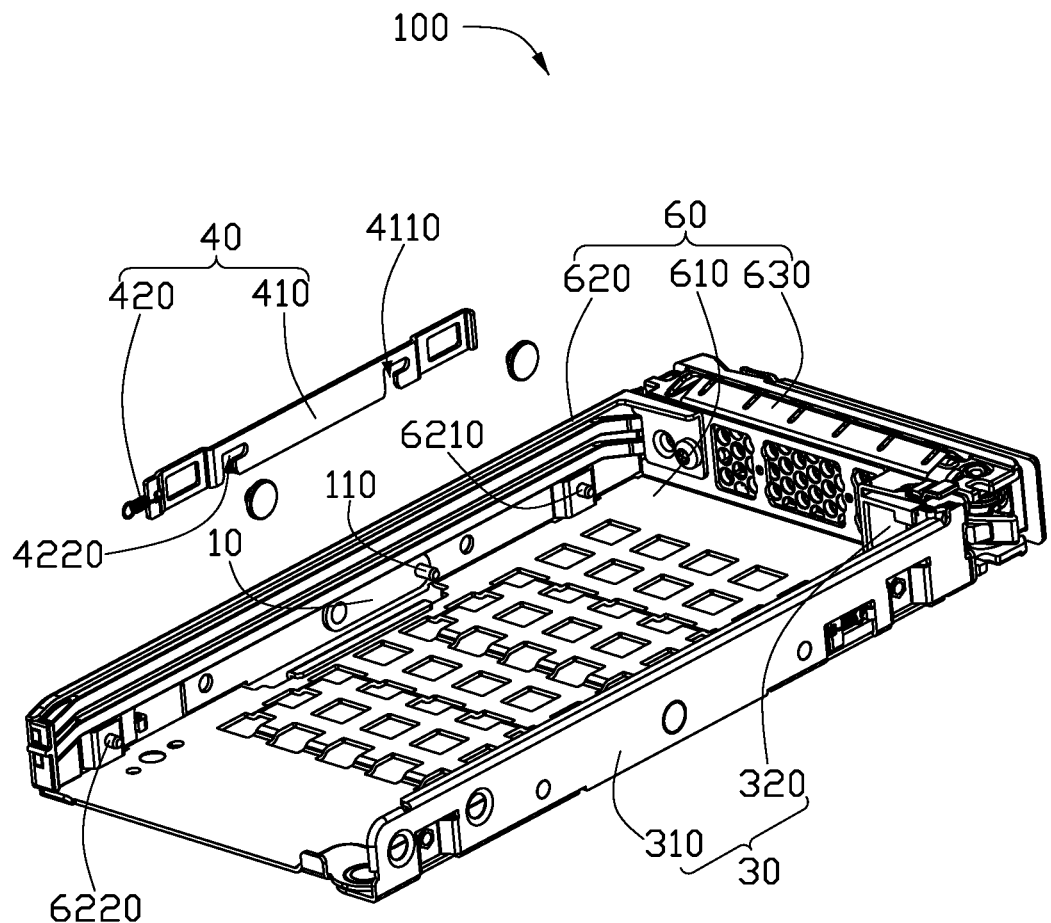
FIG. 1 is a partial exploded, isometric view of an embodiment of a hard disk bracket showing a first rotating bracket.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
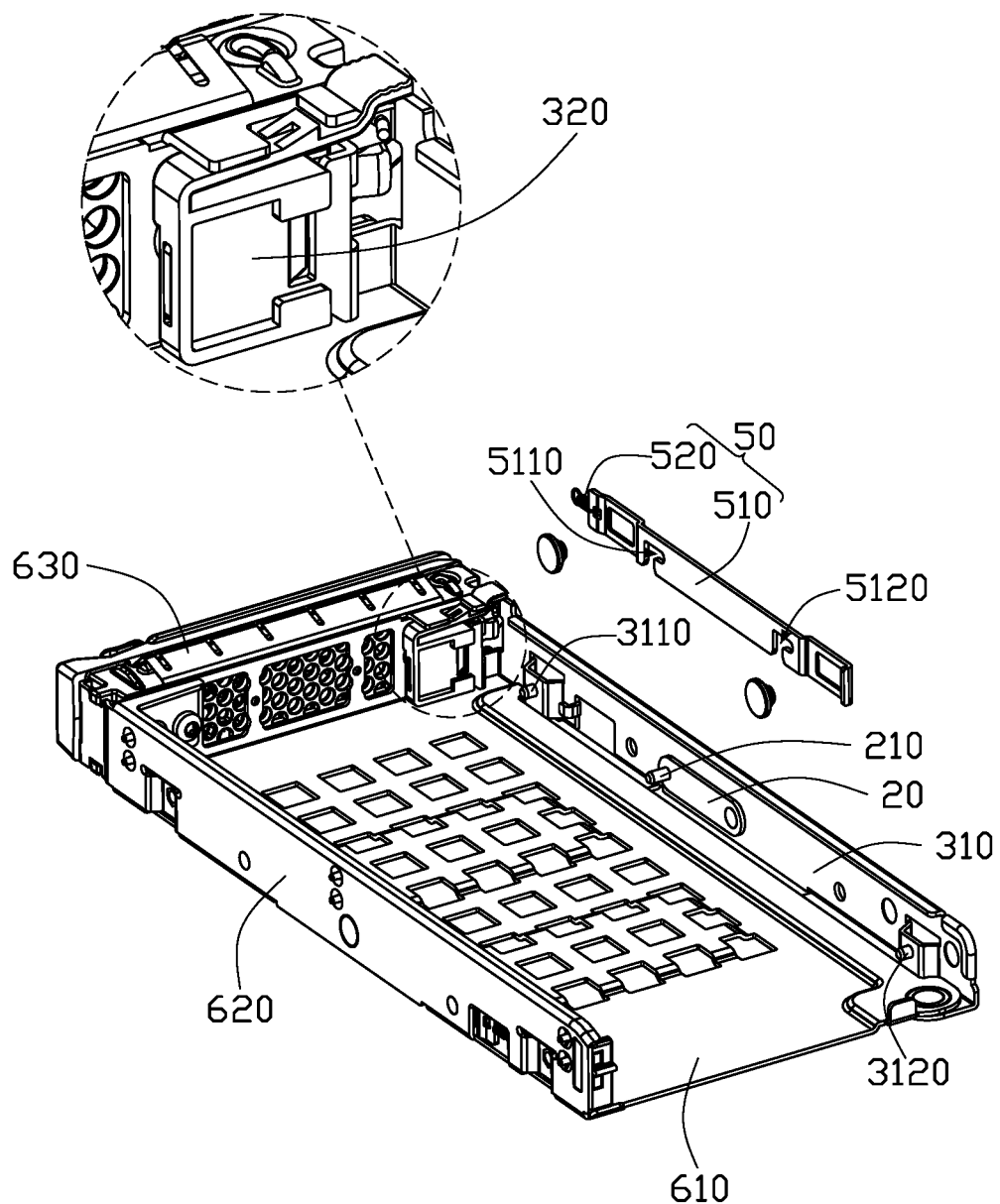
FIG. 2 is a partial exploded, isometric view of the hard disk bracket in FIG. 1 showing a second rotating bracket.

FIG. 1 and FIG. 2 show an embodiment of a hard disk bracket 100 for selectively mounting a first type of hard disk or a second type of hard disk. The hard disk bracket 100 includes a rotating arm 30, a mounting frame 60, a first rotating bracket 10, a second rotating bracket 20, a first latching member 40, and a second latching member 50.

The first rotating bracket 10 has one end rotationally mounted to the mounting frame 60. The second rotating bracket 20 has one end rotationally mounted to the rotating arm 30. The rotating arm 30 has a first end rotationally mounted to the mounting frame 60. A second end of the rotating arm 30 opposite to the first end is configured to open or latch with the mounting frame 60. The first latching member 40 is mounted to the mounting frame 60 on a same side of the mounting frame 60 as the first rotating bracket 10. The second latching member 50 is mounted to the mounting frame 60 on a same side of the mounting frame 60 as the second rotating bracket 20. The first rotating bracket 10 and the second rotating bracket 20 are respectively mounted on opposite longitudinal sides of the mounting frame 60.

The first rotating bracket 10 and the second rotating bracket 20 are substantially rectangular. A first end of the first rotating bracket 10 is mounted to the mounting frame 60, and a second end of the first rotating bracket 10 opposite to the first end includes a first projection 110. A first end of the second rotating bracket 20 is mounted to the rotating arm 30, and a second end of the second rotating bracket 20 opposite to the first end includes a second projection 210. The first projection 110 and the second projection 210 cooperatively lock a hard disk 80.

Figure 3:
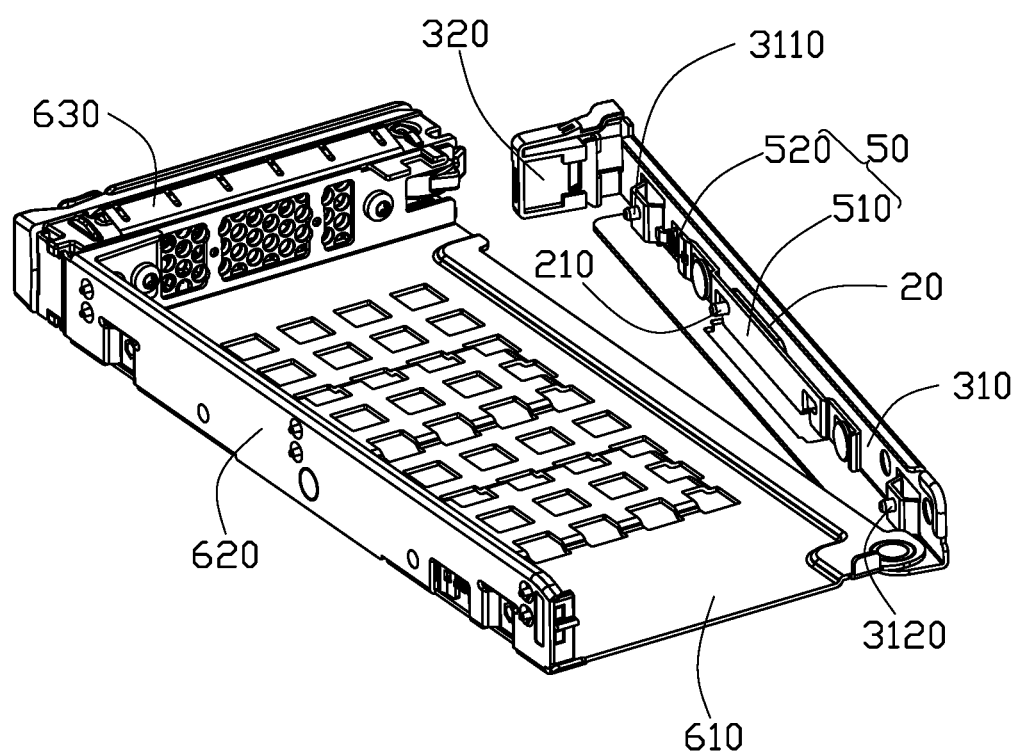
FIG. 3 is an isometric view of the rotating brackets showing a rotating arm of the second rotating bracket in an open state.

As shown in FIG. 3, the rotating arm 30 is configured to rotate relative to the mounting frame 60. The rotating arm 30 includes a cantilever 310 and a latching portion 320. A first end of the cantilever 310 is rotationally coupled to the mounting frame 60, and a second end of the cantilever 310 opposite to the first end is mounted to the latching portion 320. The latching portion 320 is substantially perpendicular to the cantilever 310. The latching portion 320 is configured to open or latch with the mounting frame 60.

Referring again to FIG. 1 and FIG. 2, the cantilever 310 includes a third projection 3110 and a fourth projection 3120. The third projection 3110 and the fourth projection 3120 are configured to lock the first type of hard disk or the second type of hard disk. The second rotating bracket 20 and the second latching member 50 are coupled to the cantilever 310.

The first latching member 40 includes a first latching plate 410 and a first spring 420. The first latching plate 410 is substantially rectangular. The first latching plate 410 is mounted to the mounting frame 60. One end of the first latching plate 410 is coupled to the mounting frame 60 through the first spring 420. The first spring 420 is hooked onto a hook located on a side plate 620 of the mounting frame 60. The second latching member 50 includes a second latching plate 510 and a second spring 520. The second latching plate 510 is substantially rectangular. The second latching plate 510 is mounted to the mounting frame 60. One end of the second latching plate 510 is coupled to the mounting frame 60 through the second spring 520. The second spring 520 is hooked onto a hook located on the rotating arm 30. The first latching plate 410 and the second latching plate 510 are respectively mounted on opposite longitudinal sides of the mounting frame 60.

The first latching plate 410 defines a first latching hole 4110 and a second latching hole 4220. The first latching hole 4110 and the second latching hole 4220 are substantially L-shaped. The first projection 110 of the first rotating bracket 10 is selectively received through the first latching hole 4110 or the second latching hole 4220. A resilient force of the first spring 420 drives the first latching plate 410 to latch the first rotating bracket 10. The second latching plate 510 defines a third latching hole 5110 and a fourth latching hole 5120. The third latching hole 5110 and the fourth latching hole 5120 are substantially L-shaped. The second projection 210 of the second rotating bracket 20 is selectively received through the third latching hole 5110 or the fourth latching hole 5120. A resilient force of the second spring 520 drives the second latching plate 510 to latch the second rotating bracket 20.

The mounting frame 60 includes a bottom plate 610, the side plate 620, and a stopping portion 630. The bottom plate 610 is substantially rectangular. The side plate 620 is mounted to a longitudinal side of the bottom plate 610. The stopping portion 630 is mounted to an end of the bottom plate 610. The side plate 620 is mounted to the stopping portion 630.

The cantilever 310 has one end rotationally coupled to the bottom plate 610. The cantilever 310 is mounted opposite to the side plate 620. The latching portion 320 is configured to open or latch with the stopping portion 630. The side plate 620 includes a fifth projection 6210 and a sixth projection 6220. The fifth projection 6210 and the sixth projection 6220 are configured to lock the first type of hard disk or the second type of hard disk. The first rotating bracket 10 and the first latching member 40 are coupled to the side plate 620.

Figure 4:
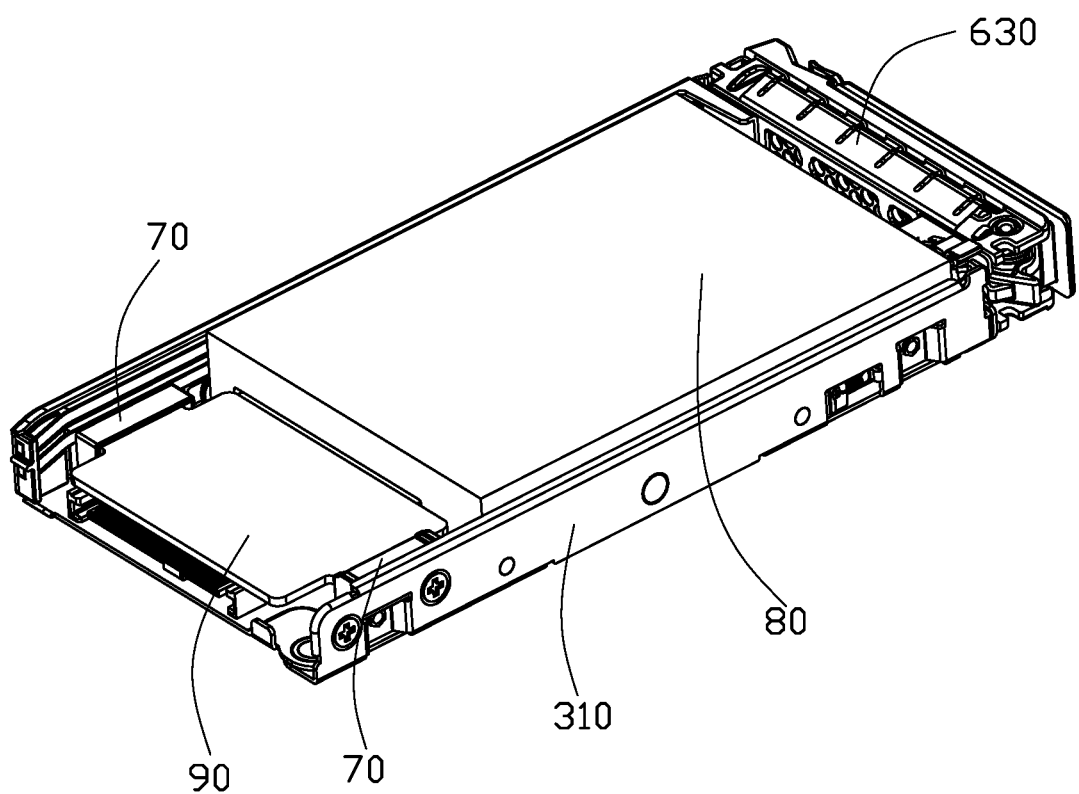
FIG. 4 is an isometric view of the hard disk bracket mounting a first type of hard disk.

Referring to FIG. 4, a first type of hard disk is mounted in the hard disk bracket 100. The first type of hard disk includes a hard disk 80 and an expansion card 90. The side plate 620 and the cantilever 310 each include a mounting latch 70. The mounting latches 70 are configured to latch the expansion card 90. The mounting latches 70 are located at an end of the side plate 620 opposite the end where the side plate 620 is mounted to the stopping portion 630.

The first projection 110 of the first rotating bracket 10 is latched within the second latching hole 4220 of the first latching plate 410, and the second projection 210 of the second rotating bracket 20 is latched within the fourth latching hole 5120 of the second latching plate 510. The first projection 110, the second projection 210, the third projection 3110, and the fifth projection 6210 cooperatively lock the hard disk 80, and the mounting latches 70 lock the expansion card 90.

Figure 5:
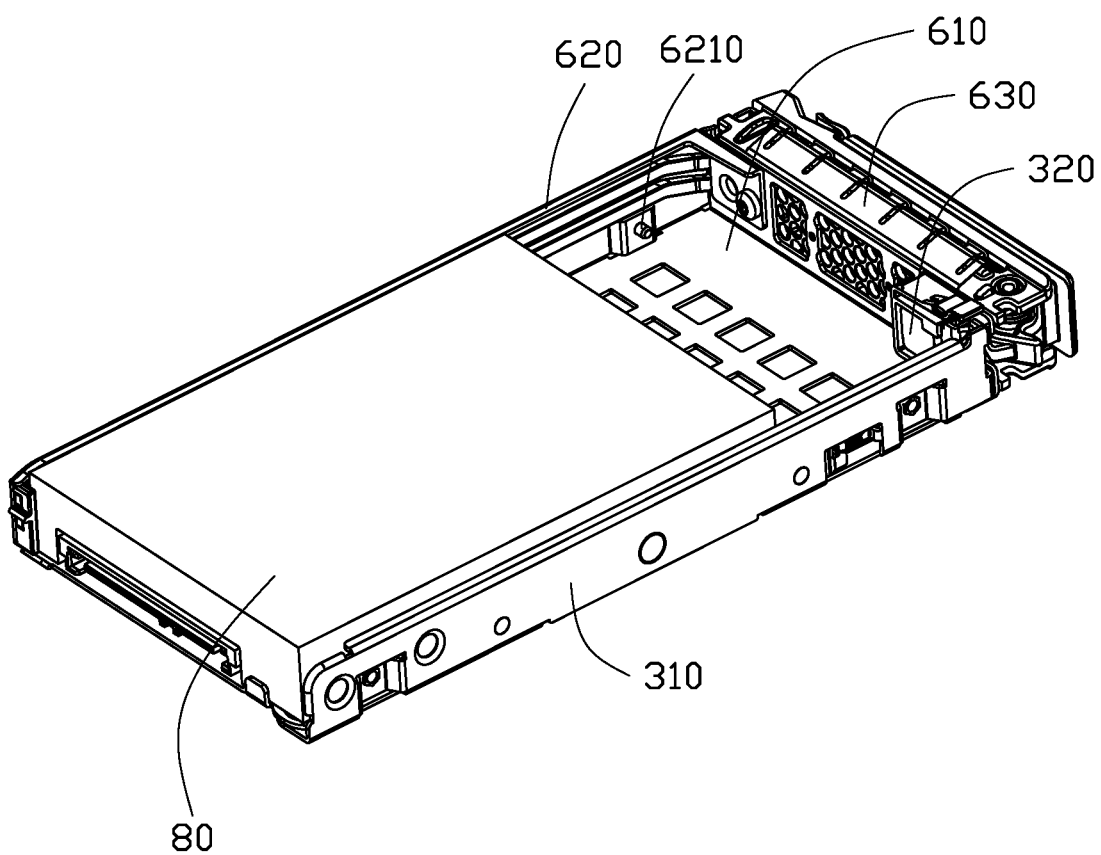
FIG. 5 is an isometric view of the hard disk bracket mounting a second type of hard disk.

Referring to FIG. 5, a second type of hard disk is mounted in the hard disk bracket 100. The second type of hard disk has the hard disk 80, and no expansion card.

The latching portion 320 of the rotating arm 30 is opened from the stopping portion 630. The expansion card 90 is removed from the hard disk 80. The first latching plate 410 and the second latching plate 510 are manually moved to stretch the first spring 420 and the second spring 520. In one embodiment, the first latching plate 410 is moved toward the stopping portion 630 to stretch the first spring 420, and the second latching plate 510 is moved away from the stopping portion 630 to stretch the second spring 520. The first rotating bracket 10 and the second rotating bracket 20 are rotated 180 degrees, so that the first projection 110 is rotated from the second latching hole 4220 to the first latching hole 4110, and the second projection 210 is rotated from the fourth latching hole 5120 to the third latching hole 5110. After the first projection 110 is received within the first latching hole 4110 and the second projection 210 is received within the third latching hole 5110, the first latching plate 410 and the second latching plate 510 are released, so that a resilient force of the first spring 420 drives the first latching plate 410 to move away from the stopping portion 630 and the second spring 520 drives the second latching plate 510 to move toward the stopping portion 630. Thus, the first projection 110 is latched within the first latching hole 4110, and the second projection 210 is latched within the second latching hole 5110.

The mounting latches 70 are removed from the side plate 620 and the cantilever 310, and the hard disk 80 is mounted within the hard disk bracket 100. The first projection 110, the second projection 210, the fourth projection 3120, and the sixth projection 6220 cooperatively lock the hard disk 80.

The hard drive bracket 80 may be mounted within a chassis (not shown) of an electronic device for mounting the first type of hard disk or the second type of hard disk. Thus, screws are not required for mounting the hard disk.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A hard disk bracket adapted for selectively mounting a first type of hard disk or a second type of hard disk, the hard disk bracket comprising:
a mounting frame;
a rotating arm comprising a first end rotationally coupled to the mounting frame and a second end opposite to the first end configured to release or latch the first type of hard disk or the second type of hard disk;
a first rotating bracket having a first end rotationally coupled to the mounting frame and a second end opposite to the first end rotatable about the first end;
a second rotating bracket having a first end rotationally coupled to the rotating arm and a second end opposite to the first end rotatable about the first end;
a first latching member mounted to the mounting frame;
a second latching member mounted to the rotating arm; wherein:
the first rotating bracket and the second rotating bracket are rotatable between a first position, where the first rotating bracket and the second rotating bracket are configured to mount the first type of hard disk, and a second position, where the first rotating bracket and the second rotating bracket are configured to mount the second type of hard disk;
the first latching member and the second latching member latch the first rotating bracket and the second rotating bracket in the first position or the second position.

2. The hard disk bracket of claim 1, wherein the first rotating bracket comprises a first projection at the second end of the first rotating bracket, and the second rotating bracket comprises a second projection at the second end of the second rotating bracket, the first projection and the second projection cooperatively lock the first type of hard disk.

3. The hard disk bracket of claim 1, wherein:
the first latching member comprises a first latching plate and a first resilient member, one end of the first latching plate being coupled to the mounting frame through the first resilient member;
the first latching plate defines a first latching hole and a second latching hole;

the first rotating bracket rotates between the first position and the second position and drives the first projection to be selectively received in the first latching hole or the second latching hole;

the first resilient member drives the first latching plate to latch the first rotating bracket;

the second latching member comprises a second latching plate and a second resilient member, one end of the second latching plate coupled to the rotating arm through the second resilient member;

the second latching plate defines a third latching hole and a fourth latching hole;

the second rotating bracket rotates between the first position and the second position and drives the second projection to be selectively received in the third latching hole or the fourth latching hole;

the second resilient member drives the second latching plate to latch the second rotating bracket.

4. The hard disk bracket of claim 3, wherein the first resilient member and the second resilient member are springs.

5. The hard disk bracket of claim 4, wherein:

the first latching hole and the second latching hole are substantially L-shaped;

the third latching hole and the fourth latching hole are substantially L-shaped;

to switch the first latching hole or the second latching hole to receive the first projection, the first latching plate is moved to stretch the first spring, the first rotating bracket is rotated 180 degrees to move the first projection from one of the first latching hole or the second latching hole to the other one of the first latching hole or the second latching hole, the first latching plate is released, and the first spring drives the first latching plate to move to latch the first projection within the other one of the first latching hole or the second latching hole;

to switch the third latching hole or the fourth latching hole to receive the second projection, the second latching plate is moved to stretch the second spring, the second rotating bracket is rotated 180 degrees to move the second projection from one of the third latching hole or the fourth latching hole to the other one of the third latching hole or the fourth latching hole, the second latching plate is released, and the second spring drives the second latching plate to move to latch the second projection within the other one of the third latching hole or the fourth latching hole.

6. The hard disk bracket of claim 1, wherein:

the rotating arm comprises a cantilever and a latching portion;

the cantilever comprises a first end rotationally coupled to the mounting frame and a second end opposite to the first end coupled to the latching portion;

the latching portion is configured to open or latch with the mounting frame.

7. The hard disk bracket of claim 6, wherein the cantilever comprises a third projection and a fourth projection, the third projection and the fourth projection being configured to lock the first type of hard disk.

8. The hard disk bracket of claim 6, wherein:

the mounting frame comprises a base plate, a side plate, and a stopping portion;

the stopping portion is mounted to one end of the base plate;

the side plate is mounted to a side of the base plate and is coupled to the stopping portion;

the cantilever is mounted to a side of the base plate opposite the side plate;

the cantilever comprises one end rotationally coupled to the base plate;

the latching portion is configured to open or latch with the stopping portion.

9. The hard disk bracket of claim 8, wherein the side plate comprises a fifth projection and a sixth projection, the fifth projection and the sixth projection being configured to lock the second type of hard disk.

10. The hard disk bracket of claim 1, wherein the mounting frame and the rotating arm each comprise mounting latches for respectively locking the first type of hard disk and the second type of hard disk.

11. A chassis comprising a hard disk bracket for selectively mounting a first type of hard disk or a second type of hard disk, the hard disk bracket comprising:

a mounting frame;

a rotating arm comprising a first end rotationally coupled to the mounting frame and a second end opposite to the first end configured to release or latch the first type of hard disk or the second type of hard disk;

a first rotating bracket having a first end rotationally coupled to the mounting frame and a second end opposite to the first end rotatable about the first end;

a second rotating bracket having a first end rotationally coupled to the rotating arm and a second end opposite to the first end rotatable about the first end;

a first latching member mounted to the mounting frame;

a second latching member mounted to the rotating arm; wherein:

the first rotating bracket and the second rotating bracket are rotatable between a first position, where the first rotating bracket and the second rotating bracket are configured to mount the first type of hard disk, and a second position, where the first rotating bracket and the second rotating bracket are configured to mount the second type of hard disk;

the first latching member and the second latching member latch the first rotating bracket and the second rotating bracket in the first position or the second position.

12. The chassis of claim 11, wherein the first rotating bracket comprises a first projection at the second end of the first rotating bracket, and the second rotating bracket comprises a second projection at the second end of the second rotating bracket, the first projection and the second projection cooperatively lock the first type of hard disk.

13. The chassis of claim 11, wherein:

the first latching member comprises a first latching plate and a first resilient member, one end of the first latching plate being coupled to the mounting frame through the first resilient member;

the first latching plate defines a first latching hole and a second latching hole;

the first rotating bracket rotates between the first position and the second position and drives the first projection to be selectively received in the first latching hole or the second latching hole;

the first resilient member drives the first latching plate to latch the first rotating bracket;

the second latching member comprises a second latching plate and a second resilient member, one end of the second latching plate coupled to the rotating arm through the second resilient member;

the second latching plate defines a third latching hole and a fourth latching hole;

the second rotating bracket rotates between the first position and the second position and drives the second projection to be selectively received in the third latching hole or the fourth latching hole;

the second resilient member drives the second latching plate to latch the second rotating bracket.

14. The chassis of claim 13, wherein the first resilient member and the second resilient member are springs.

15. The chassis of claim 14, wherein:

the first latching hole and the second latching hole are substantially L-shaped;

the third latching hole and the fourth latching hole are substantially L-shaped;

to switch the first latching hole or the second latching hole to receive the first projection, the first latching plate is moved to stretch the first spring, the first rotating bracket is rotated 180 degrees to move the first projection from one of the first latching hole or the second latching hole to the other one of the first latching hole or the second latching hole, the first latching plate is released, and the first spring drives the first latching plate to move to latch the first projection within the other one of the first latching hole or the second latching hole;

to switch the third latching hole or the fourth latching hole to receive the second projection, the second latching plate is moved to stretch the second spring, the second rotating bracket is rotated 180 degrees to move the second projection from one of the third latching hole or the fourth latching hole to the other one of the third latching hole or the fourth latching hole, the second latching plate is released, and the second spring drives the second latching plate to move to latch the second projection within the other one of the third latching hole or the fourth latching hole.

16. The chassis of claim 11, wherein:

the rotating arm comprises a cantilever and a latching portion;

the cantilever comprises a first end rotationally coupled to the mounting frame and a second end opposite to the first end coupled to the latching portion;

the latching portion is configured to open or latch with the mounting frame.

17. The chassis of claim 16, wherein the cantilever comprises a third projection and a fourth projection, the third projection and the fourth projection being configured to lock the first type of hard disk.

18. The chassis of claim 16, wherein:

the mounting frame comprises a base plate, a side plate, and a stopping portion;

the stopping portion is mounted to one end of the base plate;

the side plate is mounted to a side of the base plate and is coupled to the stopping portion;

the cantilever is mounted to a side of the base plate opposite the side plate;

the cantilever comprises one end rotationally coupled to the base plate;

the latching portion is configured to open or latch with the stopping portion.

19. The chassis of claim 18, wherein the side plate comprises a fifth projection and a sixth projection, the fifth projection and the sixth projection being configured to lock the second type of hard disk.

20. The chassis of claim 11, wherein the mounting frame and the rotating arm each comprise mounting latches for respectively locking the first type of hard disk and the second type of hard disk.

* * * * *